United States Patent
Kim et al.

(10) Patent No.: US 8,077,791 B2
(45) Date of Patent: Dec. 13, 2011

(54) OPTIMAL TCM CODEC SEARCH METHOD FOR DUAL STREAM SYSTEMS, AND ENCODER/DECODER USING THE SAME

(75) Inventors: Sung-Hoon Kim, Daejon (KR); Jae-Young Lee, Seoul (KR); Seung-Won Kim, Fairfax, VA (US); Soo-In Lee, Daejon (KR); Chieteuk Ahn, Daejon (KR); Ho-Kyoung Lee, Gyeonggi-do (KR); Chang-Joong Kim, Seoul (KR)

(73) Assignee: Electronics and Telecommunications Research Institute, Daejon (KR)

(*) Notice: Subject to any disclaimer, the term of this patent is extended or adjusted under 35 U.S.C. 154(b) by 537 days.

(21) Appl. No.: 11/995,274

(22) PCT Filed: Jul. 11, 2006

(86) PCT No.: PCT/KR2006/002724
§ 371 (c)(1),
(2), (4) Date: Mar. 12, 2009

(87) PCT Pub. No.: WO2007/008030
PCT Pub. Date: Jan. 18, 2007

(65) Prior Publication Data
US 2009/0213956 A1    Aug. 27, 2009

(30) Foreign Application Priority Data
Jul. 11, 2005 (KR) .................. 10-2005-0062197

(51) Int. Cl.
H04L 23/02 (2006.01)
(52) U.S. Cl. .......................... 375/265
(58) Field of Classification Search ............... 375/262, 375/265, 295, 316, 340–341; 714/792, 795–796
See application file for complete search history.

(56) References Cited

U.S. PATENT DOCUMENTS
6,081,562 A    6/2000    He et al.
(Continued)

FOREIGN PATENT DOCUMENTS
CN    1425243 A    6/2003
(Continued)

OTHER PUBLICATIONS
International Search Report—Mailed Oct. 19, 2006.
(Continued)

*Primary Examiner* — Khanh C Tran
(74) *Attorney, Agent, or Firm* — Ladas & Parry LLP

(57) ABSTRACT

Provided is a method for searching for an optimal coder suitable to a dual stream transmission method of a DTV transceiving apparatus, and an encoder and a decoder employing the optimal coder searching method. The optimal coder searching method includes the steps of: a) determining a mixed pattern of normal stream and robust stream; b) determining a trellis structure of the robust stream which is applied to the mixed pattern based on how coders are connected; c) forming a dual stream trellis by mixing a trellis of the normal stream, which is a normal stream trellis, and a trellis of the robust stream, which is a robust stream trellis; d) computing a free distance at departing points of the dual stream trellis structure based on a dual stream free distance computation termination condition; and e) determining the optimal coder based on the free distance.

12 Claims, 6 Drawing Sheets

U.S. PATENT DOCUMENTS

| | | | |
|---|---|---|---|
| 6,973,137 B2* | 12/2005 | Birru et al. | 375/265 |
| 7,733,972 B2* | 6/2010 | Fu et al. | 375/265 |
| 2002/0181581 A1* | 12/2002 | Birru et al. | 375/240.01 |
| 2002/0194570 A1* | 12/2002 | Birru et al. | 714/792 |
| 2003/0079173 A1* | 4/2003 | Birru | 714/792 |
| 2003/0099303 A1* | 5/2003 | Birru et al. | 375/265 |
| 2005/0031049 A1 | 2/2005 | Seier et al. | |

FOREIGN PATENT DOCUMENTS

| | | |
|---|---|---|
| JP | 10-098394 | 4/1998 |
| KR | 1020030026236 | 3/2003 |
| KR | 1020040001296 | 1/2004 |
| KR | 1020040013815 A | 2/2004 |
| KR | 1020040063779 | 7/2004 |
| KR | 1020050049923 | 5/2005 |
| KR | 1020050097435 | 7/2005 |
| KR | 1020050109052 | 11/2005 |
| KR | 1020060047771 | 5/2006 |
| WO | 02100026 | 12/2002 |

OTHER PUBLICATIONS

KIPO Notice of Patent Grant dated Apr. 1, 2008 for the corresponding application KR 10-2005-0062197.

* cited by examiner v: The number of memories in robust stream coder
m: State of memories in normal stream coder
n: State of memories in Robust stream coder Trellis of 1/3 rate coder    Trellis of 1/6 rate coder

OPTIMAL TCM CODEC SEARCH METHOD FOR DUAL STREAM SYSTEMS, AND ENCODER/DECODER USING THE SAME

TECHNICAL FIELD

The present invention relates to a Digital Television (DTV) transceiving apparatus for transmitting/receiving dual stream, which is a part of a reception performance improvement project of the DTV standard A/53 of the Advanced Television System Committee (ATSC). More particularly, the present invention relates to a method for searching for an optimal codec suitable to a dual stream transmission method of a DTV transceiving apparatus, and an encoder and a decoder employing the optimal codec searching method.

BACKGROUND ART

The 8-Vestigial Side Band (VSB) method, which is a Digital Television (DTV) broadcasting standard adopted by the North America and Korea, hardly provides indoor and mobile reception performance desired by broadcasting companies.

To solve the problem, the Advanced Television System Committee (ATSC) has collected suggestions for improving the DTV reception performance and developed a DTV transceiving system using a dual stream structure. The present invention provides a trellis coding searching method which is used to generate robust stream in the DTV transceiving system using a dual stream structure. Conventional technologies and search algorithms search only for an optimal single stream codec. When the single stream codec search algorithm is used to search for an optimal dual stream codec, it cannot find out an optimal codec due to missing of a free distance computation termination condition that appears only in dual stream. The present invention provides the free distance termination condition to search for an optimal dual stream codec.

DISCLOSURE

Technical Problem

It is, therefore, an object of the present invention to provide a method for searching for an optimal codec suitable to a dual stream transmission method, and an encoder and a decoder employing the optimal codec searching method.

The other objects and advantages of the present invention can be understood in the following description and embodiments of the present invention. Also, it is apparent to those skilled in the art of the present invention that the objects and advantages of the present invention can be easily realized by the means as claimed and combinations thereof.

Technical Solution

In accordance with one aspect of the present invention, there is provided a method for searching for an optimal codec suitable for dual stream transmission, which includes the steps of: a) determining a mixed pattern of normal stream and robust stream; b) determining a trellis structure of the robust stream which is applied to the mixed pattern based on how codecs are connected; c) forming a dual stream trellis by mixing a trellis of the normal stream, which is a normal stream trellis, and a trellis of the robust stream, which is a robust stream trellis; d) computing a free distance at departing points of the dual stream trellis structure based on a dual stream free distance computation termination condition; and e) determining the optimal codec based on the free distance.

The mixed pattern includes a normal stream trellis or a robust stream trellis maintained as much as 4Z steps, Z being a natural number, and the dual stream trellis structure is formed to satisfy a condition that a normal stream state and a robust stream state are equal to modulo 4.

The dual stream free distance computation termination condition includes that a current step is positioned in the normal stream trellis, and that two paths reach predetermined states p and q to satisfy p=q modulo 4.

In accordance with another aspect of the present invention, there is provided an apparatus for decoding dual stream, which includes: a receiving means for converting receiving signals into baseband signals; an equalizing means for determining a symbol level of the receiving signals; and a decoding means for decoding the symbol level into data symbols. The data symbol and a subsequent state are determined in a codec determined by forming a dual stream trellis by mixing a normal stream trellis and a robust stream trellis and by referring to a dual stream free distance computation termination condition at departing points of the dual stream trellis structure.

Advantageous Effects

The present invention provides an optimal codec searching method by performing additional coding onto robust stream which are transmitted at a ½ transmission rate and creating ¼ rate robust stream to thereby improve performance of conventional standard 8-Vestigial Side Band (VSB).

DESCRIPTION OF DRAWINGS

The above and other objects and features of the present invention will become apparent from the following description of the preferred embodiments given in conjunction with the accompanying drawings, in which.

BEST MODE FOR THE INVENTION

Other objects and aspects of the invention will become apparent from the following description of the embodiments with reference to the accompanying drawings, which is set forth hereinafter. When specific description on a related art is considered to obscure the points of the present invention, the description will not be provided herein. Hereinafter, embodiments of the present invention will be described in detail with reference to the accompanying drawings.

Generally, the minimum Euclidian distance between two paths that form an error event is defined as a free distance and a coder having the maximum free distance is defined as an optimal coder in a trellis coding system. A Digital Television (DTV) transceiving apparatus, however, uses a dual stream transmission method. The dual stream, which is also called mixed stream, includes normal stream, or normal data, and robust stream, or robust data. When a conventional optimal codec searching method is applied to the dual stream transmission, problems occur. Therefore, the present invention suggests a new optimal codec search algorithm suitable to the dual stream transmission. Hereinafter, a dual stream trellis structure and an optimal codec searching method based on the dual stream trellis structure will be described.

Figure 1:
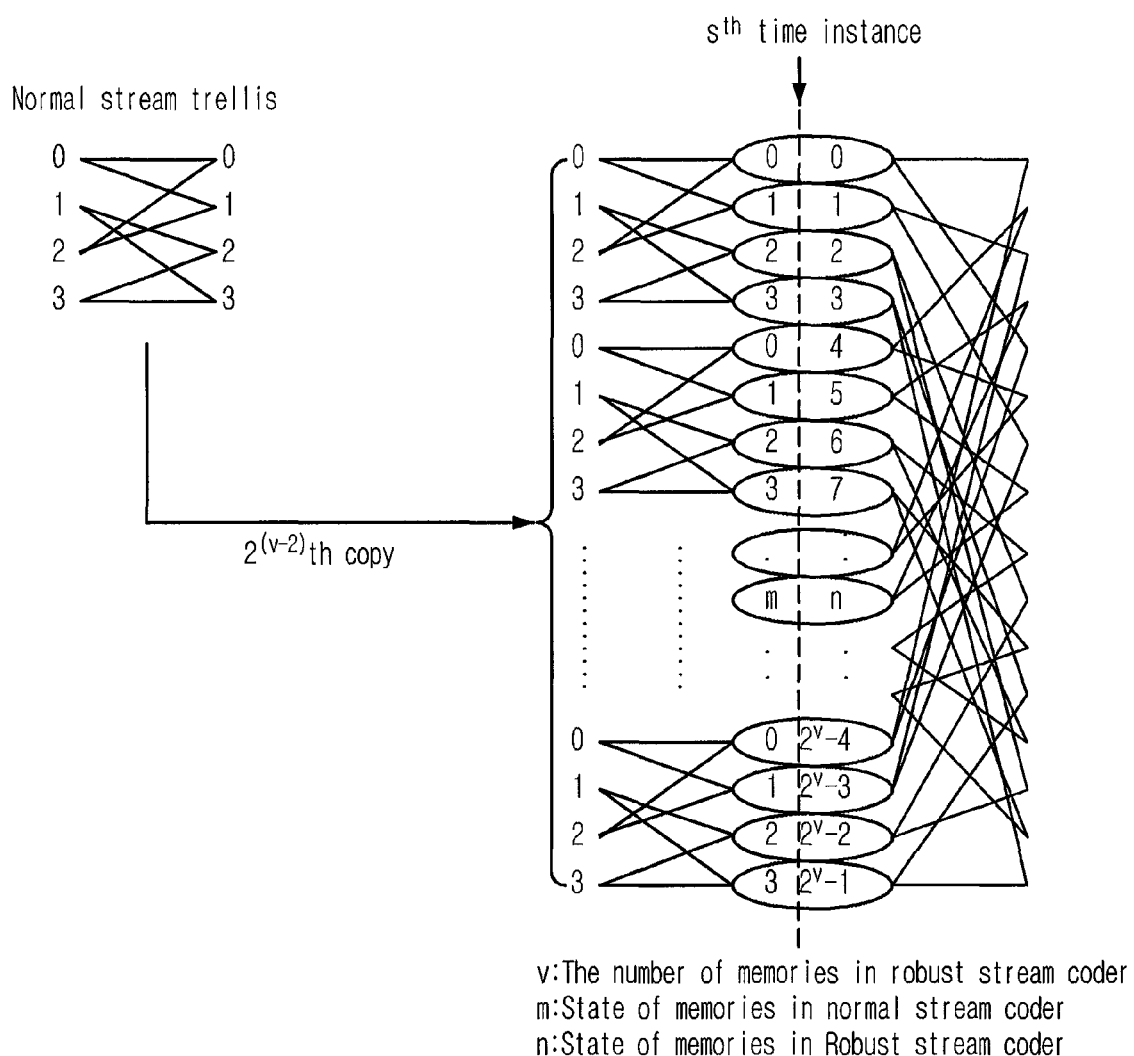
FIG. 1 is a view illustrating how to form a trellis structure with dual stream including robust data and normal data.

FIG. 1 is a view illustrating how to form a trellis structure with dual stream including robust data and normal data.

Referring to FIG. 1, a dual stream trellis structure is formed by duplicating trellis of normal data as many as a value obtained by dividing the number of robust stream states by the number of normal stream states, which is $2^{(V-2)}$, and connecting the trellis of the normal stream with the trellis of the robust stream. Herein, V denotes the number of memories in a coder for coding the robust stream; m denotes the number of states of memories in a coder for coding the normal stream; and n denotes the number of states of memories in a coder for coding the robust stream. Generally, V is 4, and the number of states of the memories in the codec for coding the robust stream is 16 states. However, the present invention is not limited to them.

Figure 2:
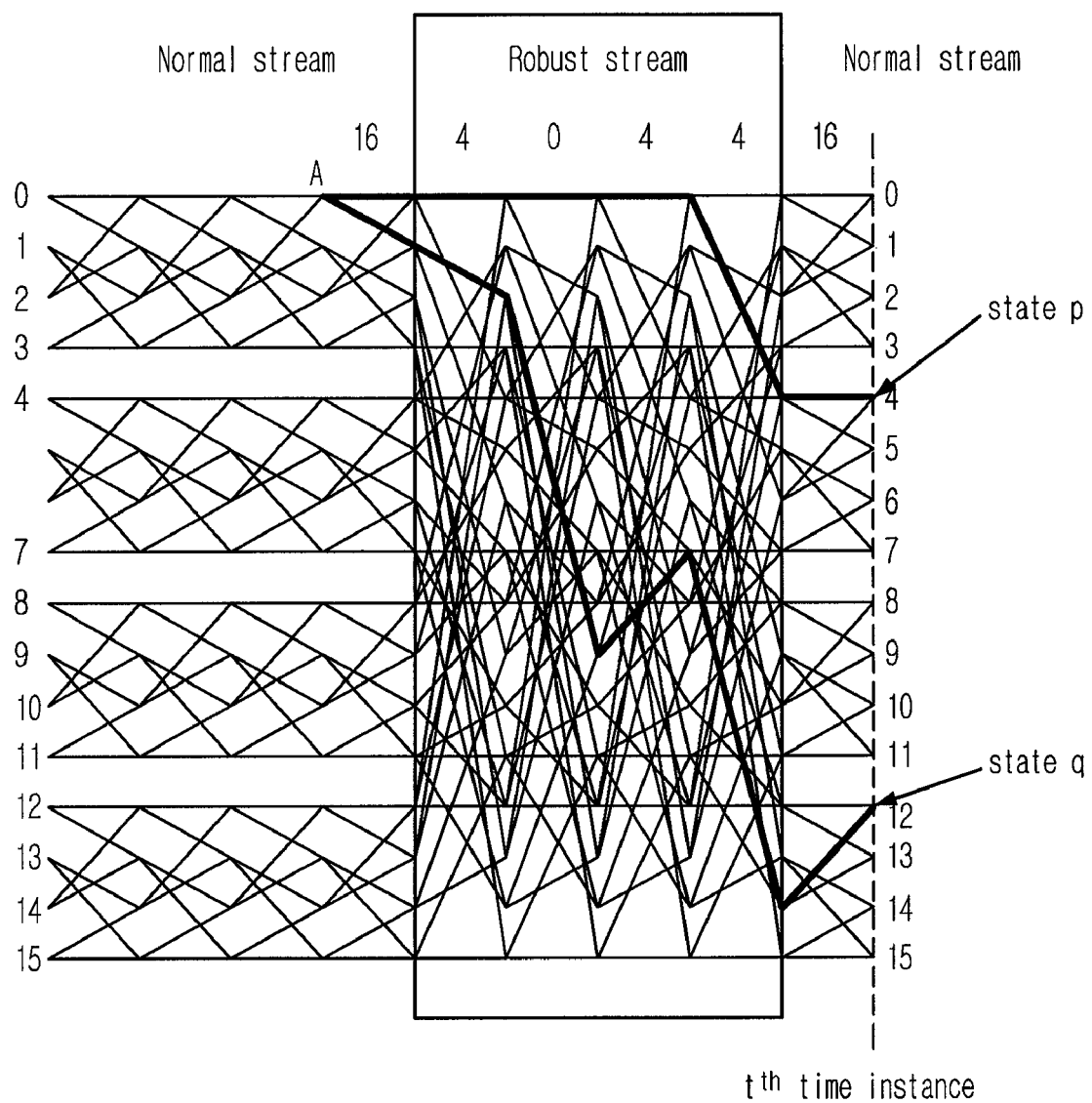
FIG. 2 is a view describing a condition for terminating computation of a free distance between two paths in a dual stream trellis structure of FIG. 1.

FIG. 2 is a view describing a condition for terminating computation of a free distance between two paths in the dual stream trellis structure of FIG. 1. A conventional free distance computation algorithm, which is developed by Saxena and Mulligan Wilson, has a termination condition that the distance computation is terminated only when two paths are combined into one state. However, an error may be caused when the termination condition is applied to a dual stream trellis structure. The present invention suggests provides a new 'dual stream free distance computation termination condition' suitable to the dual stream trellis structure.

To describe the 'dual stream free distance computation termination condition' with reference to FIG. 2, it is considered that the two paths are combined with each other and the distance computation is terminated, only when:

1) a current step t is disposed in a normal stream trellis;

2) two paths reach in the states of p and q, respectively, in the t step; and 3) p=q modulo 4.

In other words, when two paths departing from a point A in FIG. 2 pass through a robust stream trellis and arrive in a normal stream trellis. When the two paths reach states p and q on a step t to achieve a relation ship that p(4)=q(12)modulo 4, the distance computation is terminated and a free distance from the moment is computed.

In FIG. 2, the robust stream trellis is determined based on the coding rate of the robust stream encoder or how the robust stream trellis is connected to the normal stream encoder. Hereinafter, a method for generating a robust stream trellis will be described with reference to the structural outline of a dual stream coder.

Figure 3:
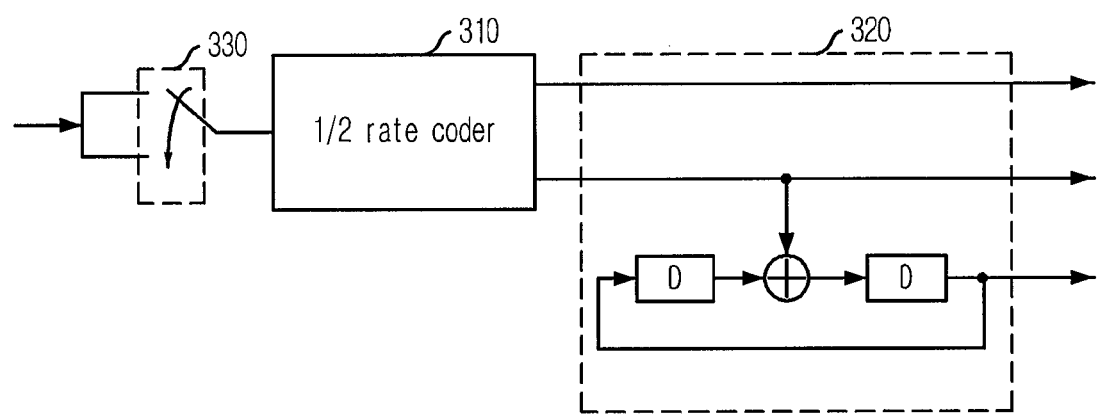
FIG. 3 is a block diagram showing an example of a ¼ rate coder designed by combining a ½ rate coder with a general 8-VSB coder.

FIG. 3 is a block diagram showing an example of a ¼ rate coder designed by combining a ½ rate coder with a general 8-VSB coder.

Referring to FIG. 3, the dual stream coder is composed of a robust stream coder 310 and an 8-VSB coder 320. In the dual stream codec, signals are repeatedly inputted to the robust stream coder 310 having a ½ coding rate through a repeater 330 to be coded in the robust stream coder 310 at a ¼ coding rate.

Figure 4:
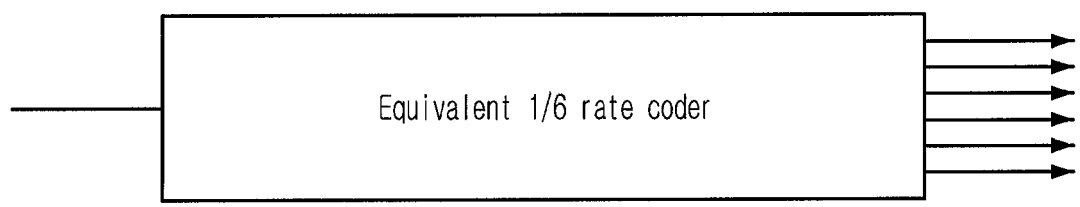
FIG. 4 is a view showing an equivalent coder model of an coder shown in FIG. 3.
Figure 5:
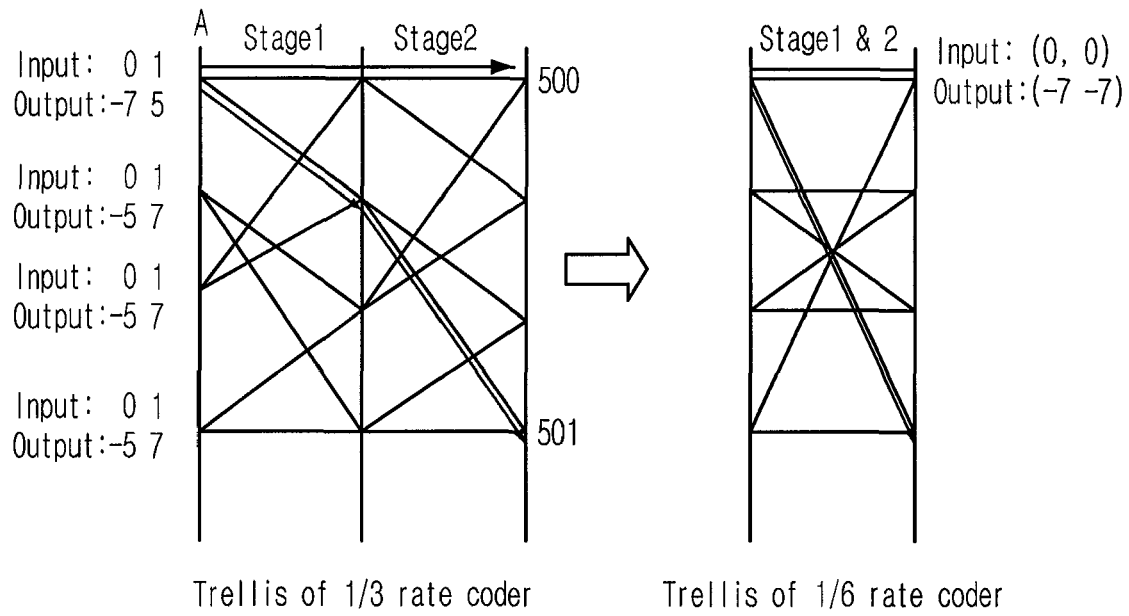
FIG. 5 is an exemplary view illustrating a trellis of an equivalent ⅙ rate coder.

FIG. 4 is a view showing an equivalent coder model of an coder shown in FIG. 3, FIG. 5 is an exemplary view illustrating a trellis of an equivalent ⅙ rate coder. Since a ½ rate coder of the dual stream coder of FIG. 3 has an arbitrary structure, it cannot determine a general trellis. Thus, as illustrated in FIG. 5, trellises of two ⅓ coders are overlapped to determine a trellis of an equivalent ⅙ rate coder. Referring to FIG. 5, an input '0' at a point 'A' follows a 500 path, and an input '1' follows a 501 path to thereby form a trellis of the equivalent ⅙ coder. The trellis becomes the robust stream trellis of FIGS. 1 and 2 to form a dual stream trellis.

Figure 6:
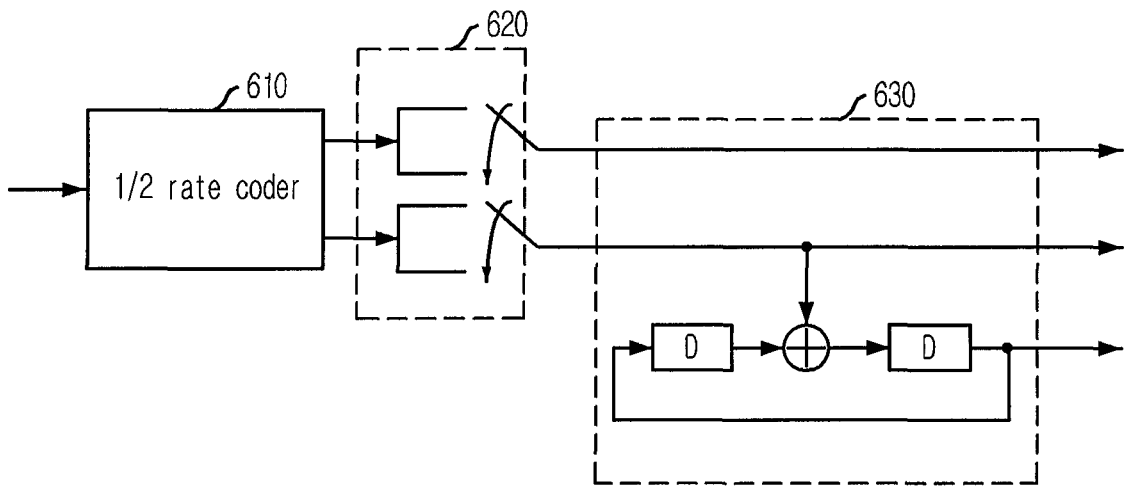
FIG. 6 is an exemplary view describing a ¼ rate coder designed by combining a ½ rate coder with a general 8-VSB coder.

FIG. 6 is an exemplary view describing a ¼ rate coder designed by combining a ½ rate coder with a general 8-VSB coder. The ¼ rate coder is designed by repeating the output of a ½ rate coder 610 through two repeaters 620 and inputting the output to an 8-VSB coder 630 to make a robust stream coder have a ¼ coding rate.

Figure 7:
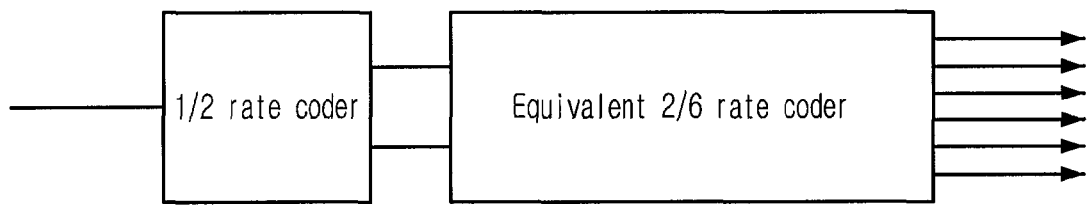
FIG. 7 is a view showing an equivalent coder model of an coder shown in FIG. 6.
Figure 8:
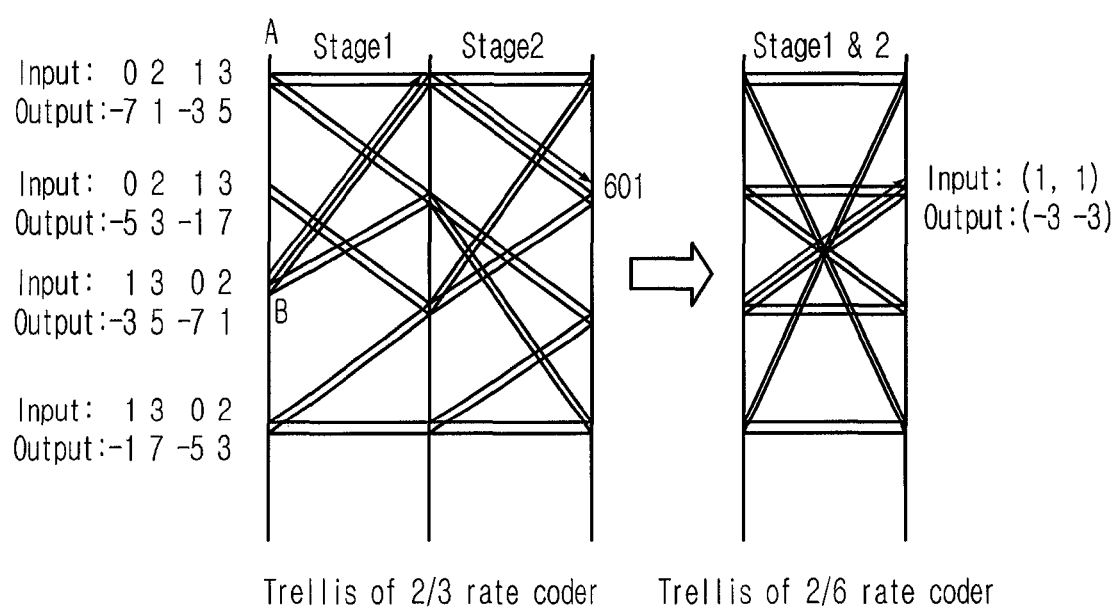
FIG. 8 is an exemplary view showing a trellis of an equivalent ⅖ rate coder.

FIG. 7 is a view showing an equivalent coder model of an encoder shown in FIG. 6, and FIG. 8 is an exemplary view showing a trellis of an equivalent ⅖ rate coder. Since the coder of FIG. 4 repeats the output of the ½ rate coder twice and inputs the output to the 8-VSB coder, its equivalent circuit is formed as shown in FIG. 7.

Referring to FIG. 8, an input '1' departing a point 'B' follows a path 601, and a trellis of an equivalent ⅖ coder is formed as illustrated in FIG. 8. The trellis becomes the robust stream trellis of FIGS. 1 and 2 to thereby form a dual stream trellis.

The present invention provides an algorithm for searching for an optimal coder having the maximum free distance by computing free distances of coders in a dual stream transceiving system. Differently from conventional technologies, the present invention targets on processing dual stream, or mixed stream trellis.

Figure 9:
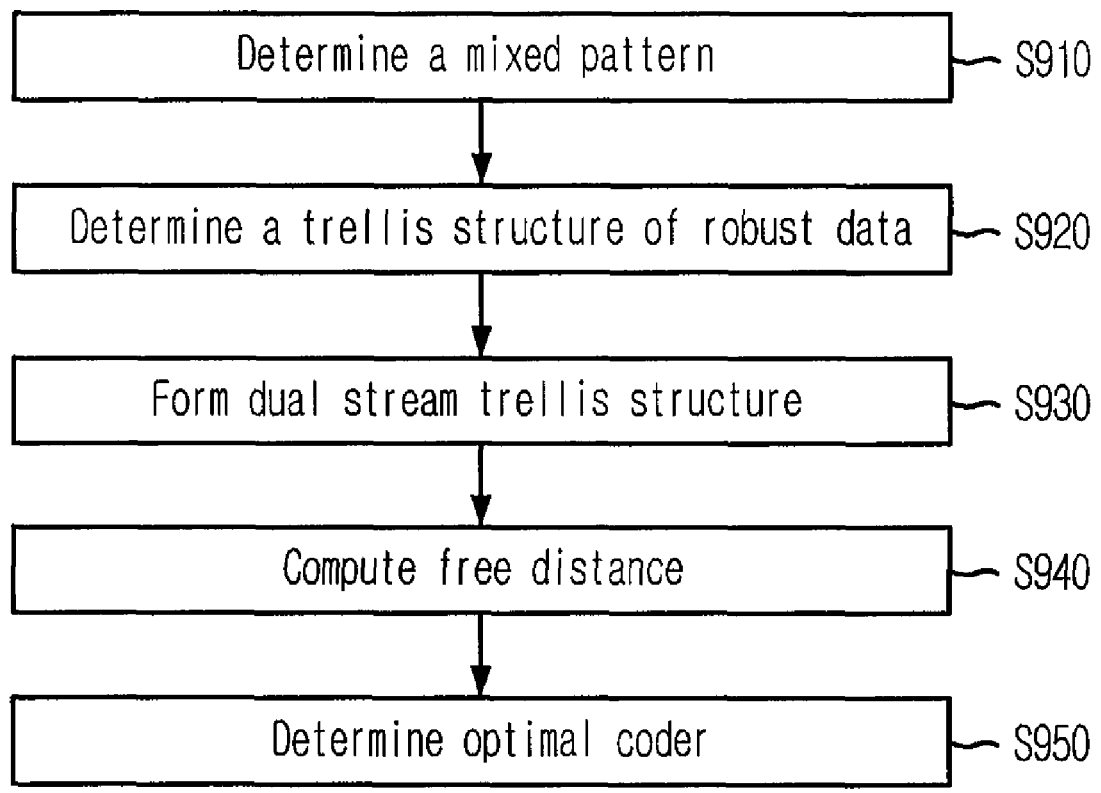
FIG. 9 is a flowchart describing an optimal codec searching method suitable to dual stream transmission in accordance with an embodiment of the present invention.

FIG. 9 is a flowchart describing an optimal codec searching method suitable to dual stream transmission in accordance with an embodiment of the present invention.

Referring to FIG. 9, at step S910, a mixed pattern of normal stream and robust stream is determined. In the mixed pattern of normal stream and robust stream, the trellises of the normal stream and the robust stream are maintained as much as 4Z steps. Herein, Z is a natural number. In other words, when N is a trellis of normal stream and R is a trellis of robust stream, the mixed pattern is formed to be NRRRRNNN . . . , NNRRRRNNNN . . . , .

Subsequently, at step S920, the structure of a robust stream trellis to be applied to the mixed pattern is determined based on connection between coders. As described with reference to FIGS. 5 and 8, the robust stream trellis is determined based on the coder structures of FIGS. 3 and 4.

When the robust stream trellis is determined, a dual stream trellis is formed as shown in FIGS. 1 and 2. Herein, the structures of the normal stream trellis and the robust stream trellis should be formed to always satisfy a condition that state m=state n (modulo) 4 [m: normal state, n=robust stream state] at a step S where the normal stream trellis is converted into a robust stream trellis or vice versa.

At step S940, a free distance is computed at the departing point of the dual stream trellis structure based on the dual stream free distance computation termination condition. At step S950, the free distance computation is repeated to determine an optimal coder.

The method of the present invention is realized as a program and stored in a computer-readable recording medium such as CD-ROM, RAM, ROM, floppy disks, hard disks, and magneto-optical disks. Since the process can be easily implemented by those skilled in the art of the present invention, description on it will not be provided herein.

While the present invention has been described with respect to certain preferred embodiments, it will be apparent to those skilled in the art that various changes and modifications may be made without departing from the scope of the invention as defined in the following claims.

What is claimed is:

1. A method for searching for an optimal codec suitable for dual stream transmission, comprising the steps of:
   a) determining a mixed pattern of normal stream and robust stream;
   b) determining a trellis structure of the robust stream which is applied to the mixed pattern based on how coders are connected;
   c) forming a dual stream trellis by mixing a trellis of the normal stream, which is a normal stream trellis, and a trellis of the robust stream, which is a robust stream trellis;
   d) computing a free distance at departing points of the dual stream trellis structure based on a dual stream free distance computation termination condition; and
   e) determining the optimal coder based on the free distance.

2. The method as recited in claim 1, wherein the mixed pattern includes a normal stream trellis or a robust stream trellis maintained as much as 4Z steps, Z being a natural number.

3. The method as recited in claim 1, wherein the dual stream trellis structure is formed to satisfy a condition that a normal stream state and a robust stream state are equal to modulo 4.

4. The method as recited in claim 1, wherein the dual stream free distance computation termination condition includes that a current step is positioned in the normal stream trellis, and that two paths reach predetermined states p and q to satisfy p=q modulo 4.

5. The method as recited in claim 1, wherein the optimal coder is a coder having a maximum free distance.

6. A method for searching for an optimal codec suitable for dual stream transmission, comprising the steps of:
   a) determining a mixed pattern of normal stream and robust stream, a trellis of the normal stream or the robust stream being maintained as much as 4Z steps where Z is a natural number;
   b) determining a robust stream trellis structure to be applied to the mixed pattern based on how coders are connected;
   c) forming a dual stream trellis by mixing the normal stream trellis with the robust stream trellis to satisfy a condition that a normal stream state and a robust stream state are equal to modulo 4;
   d) computing a free distance based on a dual stream free distance computation termination condition which includes that a current step is positioned in the normal stream trellis, and that two paths reach predetermined states p and q to satisfy p=q modulo 4;
   e) determining an optimal coder based on the free distance.

7. An apparatus for coding dual stream, comprising:
   a coder configured to form a dual stream trellis structure by mixing a normal stream trellis and a robust stream trellis, and referring to a free distance computed at departing points of the dual stream trellis structure based on a dual stream free distance computation termination condition.

8. The coding apparatus as recited in claim 7, wherein the dual stream trellis structure is formed to satisfy a condition that a normal stream state and a robust stream state are equal to modulo 4.

9. The coding apparatus as recited in claim 7, wherein the dual stream free distance computation termination condition includes that a current step is positioned in the normal stream trellis, and that two paths reach predetermined states p and q to satisfy p=q modulo 4.

10. An apparatus for decoding dual stream, comprising:
    a receiving means for converting receiving signals into baseband signals;
    an equalizing means for determining a symbol level of the receiving signals; and
    a decoding means for decoding the symbol level into data symbols,
    wherein a data symbol and a subsequent state are determined in a coder determined by forming a dual stream trellis by mixing a normal stream trellis and a robust stream trellis and by referring to a dual stream free distance computation termination condition at departing points of the dual stream trellis structure.

11. The decoding apparatus as recited in claim 10, wherein the dual stream trellis structure is formed to satisfy a condition that a normal stream state and a robust stream state are equal to modulo 4.

12. The decoding apparatus as recited in claim 10, wherein dual stream free distance computation termination condition includes that a current step is positioned in the normal stream trellis, and that two paths reach predetermined states p and q to satisfy p=q modulo 4.

* * * * *